(12) United States Patent
Peng et al.

(10) Patent No.: US 8,585,825 B2
(45) Date of Patent: Nov. 19, 2013

(54) ACOUSTIC ASSISTED SINGLE WAFER WET CLEAN FOR SEMICONDUCTOR WAFER PROCESS

(75) Inventors: Grant Peng, Fremont, CA (US); David Mui, Fremont, CA (US); Shih-Chung Kon, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 510 days.

(21) Appl. No.: 12/262,094

(22) Filed: Oct. 30, 2008

(65) Prior Publication Data

US 2010/0108093 A1 May 6, 2010

(51) Int. Cl.
*B08B 3/00* (2006.01)
*B08B 5/04* (2006.01)

(52) U.S. Cl.
USPC .................................. 134/1.3; 134/21; 134/26

(58) Field of Classification Search
None
See application file for complete search history.

(56) References Cited

U.S. PATENT DOCUMENTS

| | | | |
|---|---|---|---|
| 4,715,392 A | 12/1987 | Abe et al. | |
| 5,505,785 A | 4/1996 | Ferrell | |
| 6,230,722 B1 | 5/2001 | Mitsumori et al. | |
| 7,111,632 B2 | 9/2006 | Berman et al. | |
| 2003/0004075 A1* | 1/2003 | Suto et al. | 510/175 |
| 2004/0069319 A1 | 4/2004 | Boyd et al. | |
| 2005/0121051 A1 | 6/2005 | Okano et al. | |
| 2005/0282718 A1* | 12/2005 | Nakagawa | 510/175 |
| 2006/0128600 A1* | 6/2006 | Freer et al. | 510/491 |
| 2006/0186089 A1* | 8/2006 | Shida et al. | 216/88 |
| 2007/0169800 A1 | 7/2007 | Fani et al. | |
| 2010/0319726 A1 | 12/2010 | Boyd et al. | |

OTHER PUBLICATIONS

International Search Report dated May 13, 2010—(3 pages).

* cited by examiner

*Primary Examiner* — Nicole Blan
(74) *Attorney, Agent, or Firm* — Martine Penilla Group, LLP

(57) ABSTRACT

A method for cleaning a substrate is provided that includes applying a liquid medium to a surface of the substrate such that the liquid medium substantially covers a portion of the substrate that is being cleaned. One or more transducers are used to generate acoustic energy. The generated acoustic energy is applied to the substrate and the liquid medium meniscus such that the applied acoustic energy to the liquid medium prevents cavitation within the liquid medium. The acoustic energy applied to the substrate provides maximum acoustic wave displacement to acoustic waves introduced into the liquid medium. The acoustic energy introduced into the substrate and the liquid medium enables dislodging of the particle contaminant from the surface of the substrate. The dislodged particle contaminants become entrapped within the liquid medium and are carried away from the surface of the substrate by the liquid medium.

18 Claims, 14 Drawing Sheets

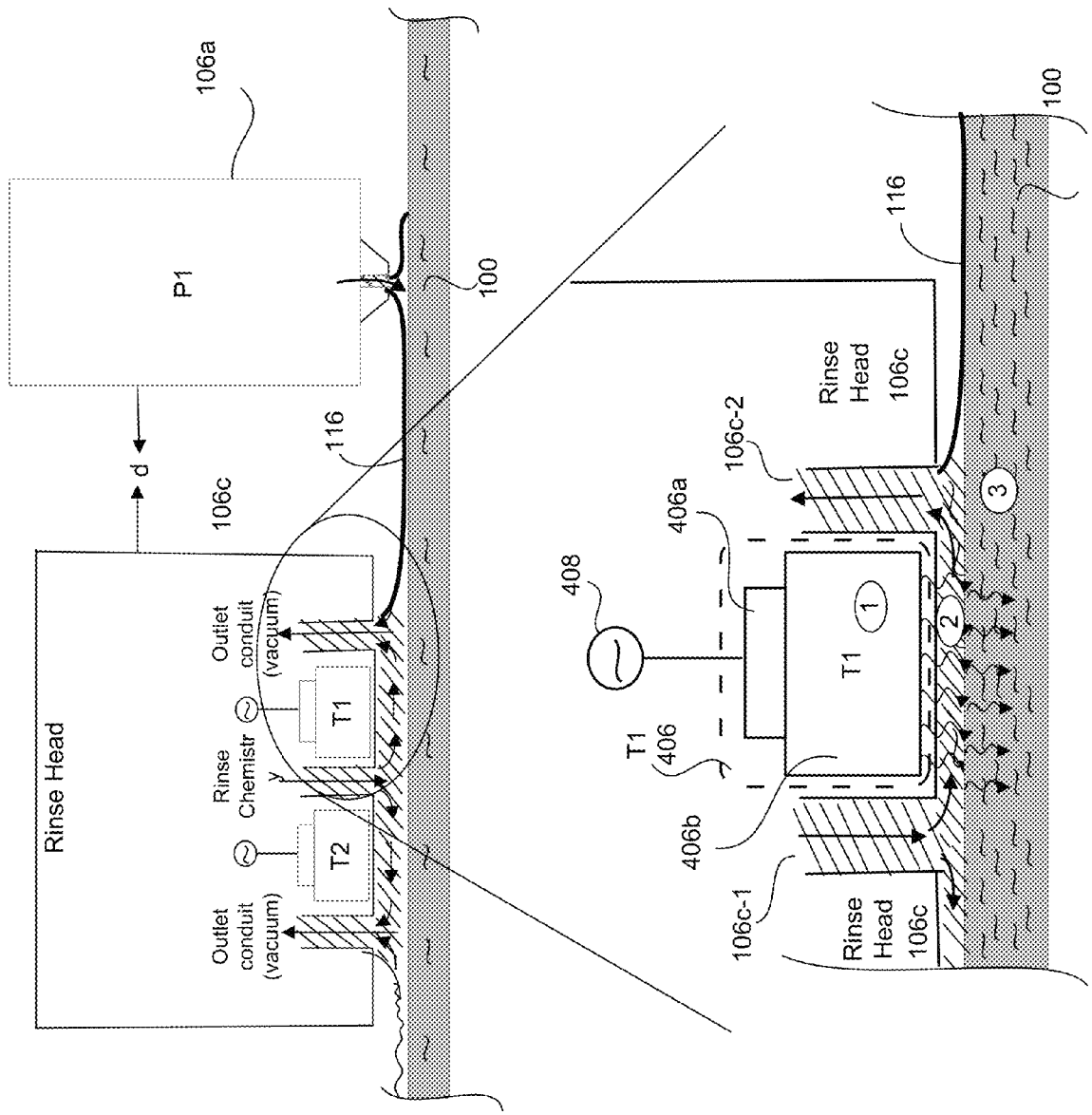

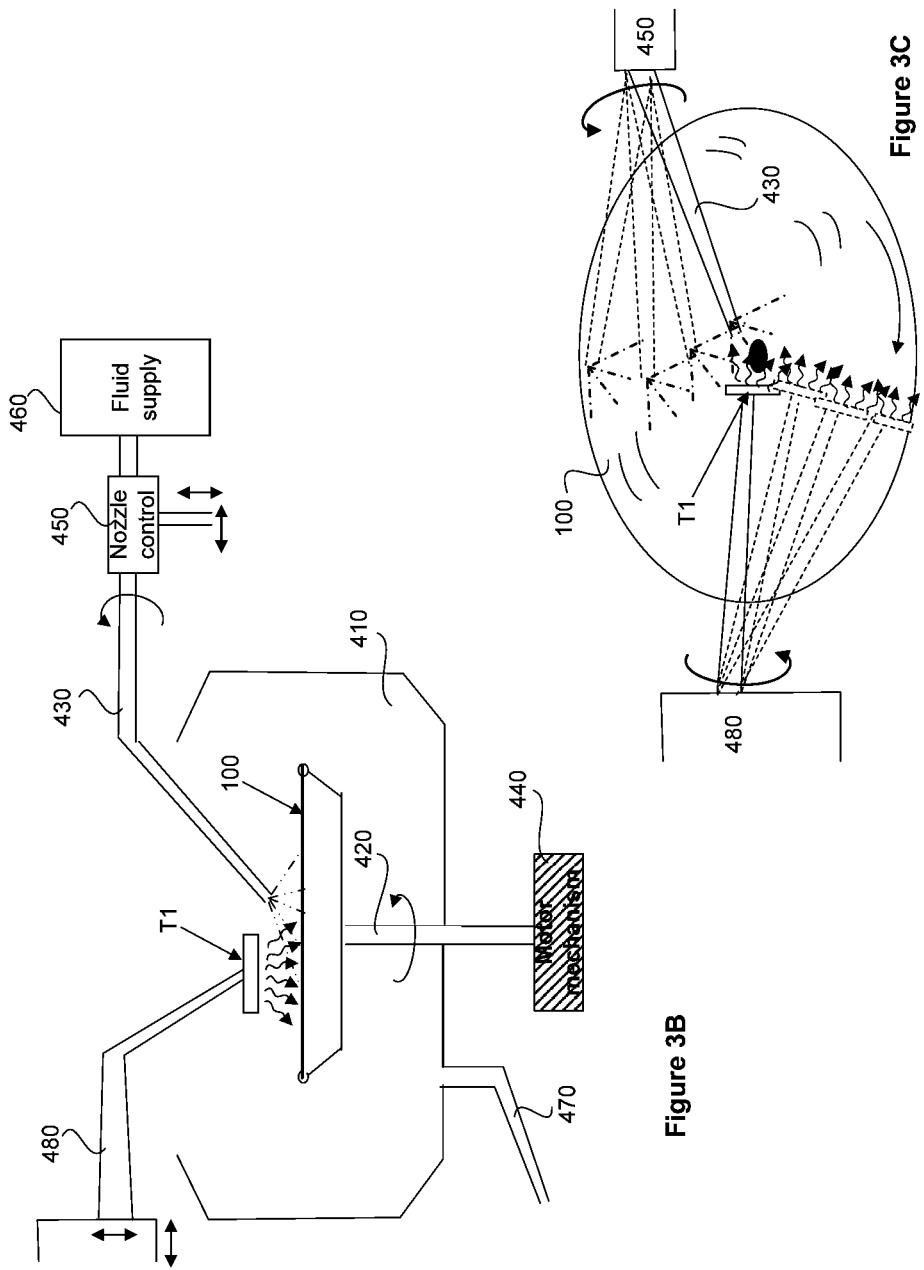

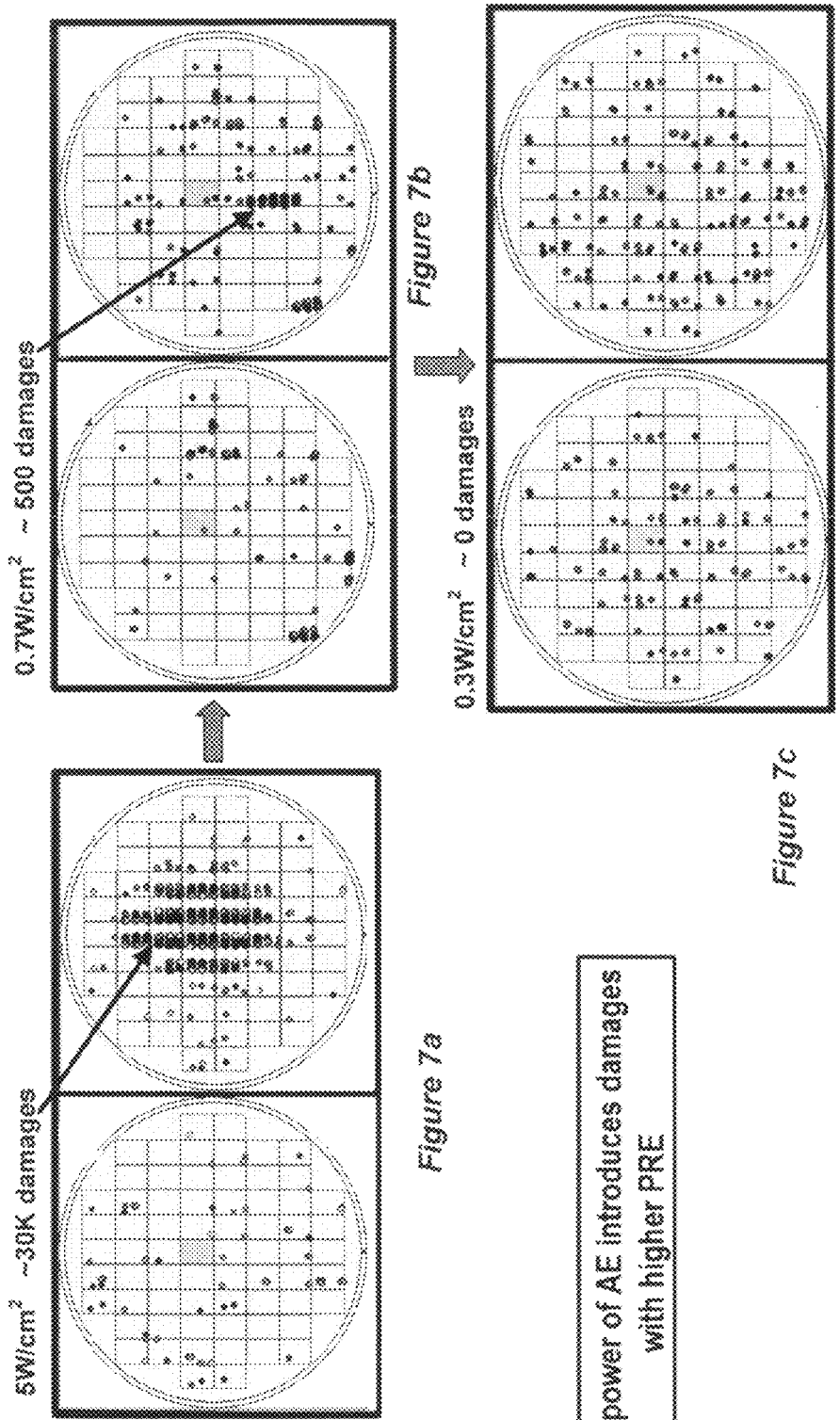

ACOUSTIC ASSISTED SINGLE WAFER WET CLEAN FOR SEMICONDUCTOR WAFER PROCESS

CROSS REFERENCE TO RELATED APPLICATION

This application is related to U.S. patent application Ser. No. 12/131,654 filed on Jun. 2, 2008, and entitled "MATERIALS FOR PARTICLE REMOVAL BY SINGLE-PHASE AND TWO-PHASE MEDIA." This application is also related to U.S. patent application Ser. No. 12/165,577, filed on Jun. 30, 2008, entitled "SINGLE SUBSTRATE PROCESSING HEAD FOR PARTICLE REMOVAL USING LOW VISCOSITY FLUID." The aforementioned patent applications are incorporated herein by reference.

BACKGROUND OF THE INVENTION

1. Field of the Invention

The present invention relates generally to the cleaning of a semiconductor substrate and, more particularly, to a method and apparatus for utilizing acoustic energy in combination with selective cleaning media to clean a semiconductor substrate following fabrication processes.

2. Description of the Related Art

In the semiconductor chip fabrication process, it is well-known that there is a need to clean and dry a substrate where a fabrication operation has been performed leaving unwanted residues on the surface of the substrate. Examples of such fabrication operations include plasma etching (e.g., via etch or trench etch for copper dual damascene applications) and chemical mechanical polishing (CMP). Various cleaning processes have been used in removing the unwanted residues from the surface of the substrate after each fabrication operation. Some of the cleaning processes that are used in removing the unwanted residues from the surface of the substrate involve propagation of acoustic energy through a liquid medium that substantially covers the surface of the substrate and using the acoustic energy to remove particles from the surface of the substrate.

Typical liquid medium that have been used during acoustic energy cleaning processes include deionized water (DIW) or any one or more of several substrate cleaning chemicals and combinations thereof such as dilute ammonium hydroxide/hydrogen peroxide solution in DIW. The propagation of acoustic energy through the liquid medium enables cleaning chiefly through cavitation, microstreaming, and chemical reaction enhancement when chemicals are used as the liquid medium. Cavitation is the rapid forming and collapsing of microscopic bubbles from dissolved gases in the liquid medium under the action of sonic agitation. Upon collapse, the bubbles release energy. The energy from the collapsed bubbles assists in particle removal through breakage of the various adhesion forces that allow the particle to adhere to the substrate. Acoustic microstreaming is the fluid motion induced by the velocity gradient from propagation of an acoustic wave through the liquid medium under megasonic vibration. The acoustic energy provides the activation energy to facilitate the chemical reactions within the liquid medium.

As the critical dimensions of features formed on the surface of the substrate continue to decrease, the number of submicron particles with dimensions that are comparable to the critical dimensions of the features increases. Due to the critical dimensions of the submicron particles, cleaning techniques using low-frequency ultrasonic energy are no longer capable of effectively removing the submicron particles from around the features. As a result, the reliability and yield of the resulting devices from the fabrication operation using ultrasonic cleaning are substantially reduced.

To overcome the ineffectiveness of the ultrasonic cleaning, megasonic energy was widely used in semiconductor manufacturing operations to clean a batch of wafers or a single wafer. The main particle removal mechanisms by megasonic cleaning are through cavitation and acoustic microstreaming. A megasonic transducer is used to create sonic pressure waves in the liquid medium within a cleaning tank in which the substrate or batch of substrates are immersed. Unwanted particulates are acted on through cavitation and microstreaming. Although the acoustic energy used in the megasonic cleaning effectively removes the unwanted particles from the surface of the substrate, the amount of acoustic energy used for providing cavitation may result in damage to the features around which the submicron particle contaminants are deposited. The damage to the features makes the associated device inoperable thereby reducing the overall yield and reliability of the devices obtained from the substrate.

It would be advantageous to find an approach for applying acoustic energy to effectively remove submicron particulate contaminants from the surface of substrates without damaging the features formed on the surface of the substrate.

It is in this context that embodiments of the invention arise.

SUMMARY OF THE INVENTION

Broadly speaking, the present invention fills these needs by providing a cleaning tool that is capable of managing, in a controlled and effective manner, the application of acoustic energy and enhanced cleaning chemistries to substrate surfaces. It should be appreciated that the present invention can be implemented in numerous ways, including as a process, an apparatus, or a system. Several inventive embodiments of the present invention are described below.

In one embodiment, a method for cleaning particle contaminants from a surface of a semiconductor substrate is provided. The method includes applying a liquid medium to the surface of the semiconductor substrate. An acoustic energy is applied to the semiconductor so as to enable the semiconductor substrate to vibrate. The vibration of the semiconductor substrate transfer the acoustic energy to the liquid medium so as to introduce acoustic wave velocity in the liquid medium applied to the surface of the substrate. The acoustic energy applied to the liquid medium is tuned so that it does not introduce cavitation in the liquid medium. The acoustic energy applied to the substrate and the liquid medium provides a force that enables dislodging the particle contaminants from the surface of the substrate. The liquid medium is selected such that the chemical structure of the liquid medium enables at least partial connection or interaction with the dislodged particle contaminants. The liquid medium with the dislodged particle contaminants is carried away from the substrate resulting in a substantially clean substrate.

In another embodiment, an apparatus for cleaning a substrate is provided that includes a first outer tank having a cavity defined by a base and one or more sidewalls extending from the base. The first tank further includes an opening opposite the base and is configured to hold a volume of a first liquid medium within the cavity defined therein. The apparatus further includes a second inner tank disposed within the first outer tank such that a cavity surrounding the second inner tank is defined in the first outer tank. The cavity of the first outer tank holds the first liquid medium. The second inner tank, in turn, includes a cavity defined by a base and one or more sidewalls extending from the base and an opening opposite the base. The second inner tank is configured to hold a volume of a second liquid medium within the cavity defined therein and to receive and to immerse the substrate into the second liquid medium contained in the cavity. A carrier mechanism is also provided to support the substrate and to immerse the substrate completely into the second liquid medium. A transducer to generate acoustic energy is provided at the base of the first outer tank. The acoustic energy generated by the transducer is applied to the substrate and the second liquid medium within the second inner tank. The acoustic energy applied to the second liquid medium is selected so as to prevent cavitation within the second liquid medium and to introduce an acoustic wave velocity into the second liquid medium. The acoustic energy applied to the substrate is selected so as to enable maximum wave displacement to the acoustic wave introduced into the second liquid medium. The acoustic energy enables the substrate and the liquid medium to work together in dislodging particle contaminants from the surface of the substrate, which then at least partially connects or interacts with the second liquid medium and is carried away by the second liquid medium.

In another embodiment, an apparatus for cleaning a substrate is provided that includes a processing chamber having a carrier mechanism configured to support and transport the substrate within the processing chamber. The substrate includes a plurality of particle contaminants on a surface that needs to be removed. The processing chamber includes at least a dispense head assembly and a rinse head assembly. The dispense head assembly is configured to supply a liquid medium as a meniscus to the surface of the substrate through an inlet conduit. The rinse head assembly is configured with at least one inlet conduit to supply a rinse chemical to rinse the surface of the substrate and at least one outlet conduit to remove the liquid medium and rinse chemical from the surface of the substrate. The rinse head is also equipped with one or more transducers to supply acoustic energy (AE) to the substrate and to the meniscus of the liquid medium applied to the surface of the substrate. The AE enables the substrate supported by the carrier mechanism to vibrate. The vibration of the substrate is transferred to the liquid medium so as to introduce an acoustic wave velocity in the liquid medium. The acoustic energy applied to the liquid medium is selected so as to prevent cavitation in the liquid medium. The combined acoustic energy applied to the liquid medium and the substrate enables the substrate and the liquid medium to simultaneously work on the particle contaminants substantially releasing the particle contaminants from the surface of the substrate. The released particle contaminants at least partially connect or interact with the liquid medium and are carried away by the velocity of the liquid medium.

The advantages of the present invention are numerous. The acoustic energy applied at each of the substrate and the liquid medium work simultaneously to successfully release the particle contaminants from the surface of the substrate. The careful selection of the amount of acoustic energy applied to the surface of the substrate ensures that the attributes of features formed near the contaminants are substantially well preserved. Consequently, enhanced yields may be achieved due to efficient substrate cleaning with substantially lower levels of contamination. Further, the chemical structure of the liquid medium applied to the substrate surface prevents re-deposition of particle contaminants and the prompt removal of the liquid medium ensures that the liquid medium does not adhere to the surface of the substrate. With simultaneous application of acoustic energy at the substrate and the liquid medium, efficient substrate cleaning is achieved while avoiding common problems, such as feature damage, that are inherent with conventional megasonic applications due to uncontrolled cavitation and microstreaming.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

FIG. 2A illustrates a substrate cleaning and drying system with a single dispense head followed by a rinse head, in accordance with one embodiment of the present invention.

FIG. 2B illustrates an explosive view of a portion of the substrate cleaning and drying system illustrated in FIG. 2A.

FIG. 3B illustrates an alternate embodiment of a spin tool illustrated in FIG. 3A.

FIG. 3C illustrates a top view of the workings of the spin tool mechanism illustrated in FIG. 3B.

FIGS. 7A through 7C illustrate damage data associated with various acoustic energy applied during the cleaning process, in one embodiment of the invention.

DETAILED DESCRIPTION OF THE PREFERRED EMBODIMENTS

An invention for methods and apparatuses for cleaning and/or drying a substrate is disclosed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

Figures 1A, 1B:
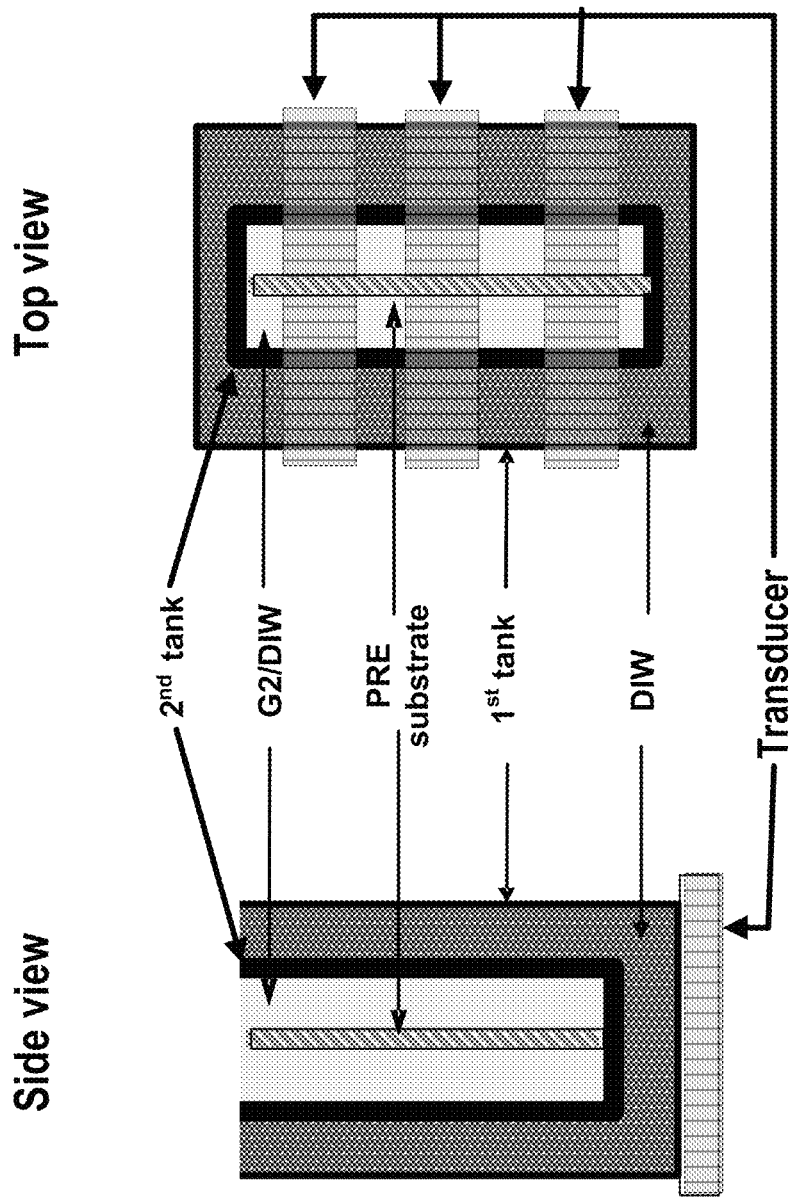
FIG. 1A illustrates a side view of a simplified block diagram of a substrate cleaning system using a dip tank, in one embodiment of the invention.
FIG. 1B illustrates a top view of the simplified block diagram of the substrate cleaning system illustrated in FIG. 1A.

FIGS. 1A and 1B illustrate an embodiment of a substrate processing system. In this embodiment, a dip tank is used for processing a substrate. It should be appreciated that the substrate processing system illustrated in FIGS. 1A and 1B is exemplary, and that any other suitable type of configuration that would enable cleaning a substrate surface using a dip tank may be utilized. FIGS. 1A and 1B illustrate a side and a top view of a dip tank system, in one embodiment of the invention. As shown, the system includes a first outer tank with a cavity formed by a base and one or more sidewalls extending from the base. An opening to the cavity is formed opposite to the base. The cavity is configured to hold a first liquid medium. A second inner tank is disposed within the first outer tank such that a cavity surrounding the second inner tank is defined in the first outer tank. The cavity in the first outer tank holds the first liquid medium. The second inner tank includes a cavity defined by a base and one or more sidewalls extending from the base. An opening opposite to the base is provided through which the substrate is introduced into the cavity of the second inner tank. The second inner tank is configured to hold a second liquid medium within the cavity. A carrier mechanism is included to support the substrate and to immerse the substrate into the second liquid medium in the second inner tank. In one embodiment, a transducer, T1, is provided at the base of the first outer tank and is used to introduce an acoustic energy to the second liquid medium contained within the second inner tank. The acoustic energy is applied to the second liquid medium through the first liquid medium in the first outer tank. The first liquid medium acts as a couplant and transmits the acoustic energy from the transducer coupled to the first outer tank to the second liquid medium within the second inner tank. A couplant, as used in this application, is defined as a substance (usually liquid) used between the transducer and a medium to permit or improve transmission of ultrasonic energy into the medium. The medium, in this embodiment, is a second liquid medium. The acoustic energy applied to the second liquid medium is transmitted to the substrate immersed in the second liquid medium so that the substrate vibrates. In this embodiment, the second liquid medium acts as a couplant for transferring acoustic energy to the substrate.

In another embodiment of the invention, two or more transducers, T1, T2, etc., are used in providing the acoustic energy to the substrate and the second liquid medium contained within the cavity of the second inner tank through an interface using appropriate couplant. The acoustic energy from the two or more transducers are supplied simultaneously so that the substrate and second liquid medium, using the acoustic energy, work together to break the adhesive force with which the particle contaminant adheres to the substrate surface thereby releasing the particle contaminants from the surface of the substrate. The acoustic energy applied to the liquid medium is selected so as to prevent cavitation within the liquid medium. Some of the features formed on the substrate may get damaged during the collapse of microscopic bubbles formed by dissolved gases during cavitation. It is, therefore, essential to minimize the damage caused by cavitation. As a result, the acoustic energy is selected so as to prevent such damage to the features formed on the substrate by avoiding cavitation in the liquid medium. The acoustic energy applied to each of the substrate and the second liquid medium is substantially less than a single high frequency acoustic energy that was applied directly to the liquid medium during a conventional megasonic cleaning process. However, the combined acoustic energy provides enough energy to break down the adhesive force with which the particle contaminants (contaminants) are bound to the surface of the substrate and assist in successfully removing the particle contaminants from the surface of the substrate without damaging the features formed near the contaminants on the surface of the substrate.

In one embodiment, the first liquid medium and the second liquid medium are the same. In this embodiment, the second inner tank includes an inlet (not shown) to replenish clean second liquid medium into the cavity of the second inner tank from a reservoir (not shown) and an outlet (not shown) to promptly remove the second liquid medium and the particle contaminants during the cleaning process. Prompt removal of contaminants and the liquid medium from the second inner tank prevents re-adhesion of the contaminants or the liquid medium to the substrate surface. Further, the chemical structure of the second liquid medium ensures contaminant re-adhesion is prevented. The outlet of the second inner tank may be connected to an inlet of the first outer tank through which the second liquid medium along with the particle contaminants is received into the first outer tank. In addition to this inlet, the first outer tank may include a second inlet connected to an external reservoir from which the first outer tank receives the first liquid medium into the cavity. An outlet (not shown) in the first outer tank is used to remove the first and the second liquid media in the first outer tank so that additional first and second liquid media may be received from the corresponding external reservoir (not shown) and the second inner tank, respectively, during the cleaning process.

In another embodiment, the first liquid medium and the second liquid medium are distinct. In one embodiment, the first liquid medium may be de-ionized water (DIW). The second liquid medium is selected based on the size and composition of the contaminants. The contaminants are analyzed and a second liquid medium is selected such that the chemical structure of the second liquid medium enables at least partial connection or interaction with the contaminants released from the surface of the substrate during the cleaning process. In one embodiment, a polymer based liquid medium is selected as the second liquid medium. The polymer based liquid medium comprises a chemical structure made up of long polymer chains that enable at least partial connection or interaction with the particle contaminants and is highly viscous. Due to the viscosity of the polymer-based liquid medium, the liquid medium needs to be removed from the surface of the substrate after a cleaning process to prevent the liquid medium from adhering to the substrate surface. For more information on the chemical structure of the polymer liquid medium, reference can be made to U.S. patent application Ser. No. 12/131,654, entitled "Materials for Particle Removal by Single-Phase and Two-phase Media," filed on Jun. 2, 2008, which is incorporated herein by reference. In one embodiment, based on the analysis, the polymer based liquid medium selected for cleaning the substrate surface is partially hydrolyzed polyacrylamide.

The combined acoustic energy applied at the substrate and in the second liquid medium creates unbalanced pressure waves in the liquid-contaminant-substrate interface, which exerts a force on the contaminants through the second liquid medium, breaking the adhesive force binding the contaminants to the substrate surface. The exerted force on the contaminants successfully releases the contaminants from the substrate surface. Once released from the substrate surface, the contaminants at least partially connect or interact and quickly get entrapped in the second liquid medium. Upon successful cleaning process, the trapped contaminants are promptly removed along with the second liquid medium from the second inner tank and clean second liquid medium is replenished into the second inner tank for subsequent substrate cleaning process. Although the embodiments have been discussed in detail with respect to cleaning a single substrate, the embodiments can be extended to clean a batch of substrates. The carrier mechanism, in this case, is configured to provide locations to receive, support and immerse the batch of substrates into the second liquid medium through the cavity that is wide enough to receive the batch of substrates during the cleaning process.

It should be noted that the frequency associated with the acoustic energy applied to the substrate and the second liquid medium can be tuned based on the size and composition of the contaminants and the type of contaminant-substrate surface interaction. When the contaminants are smaller or lighter then a higher frequency acoustic energy may be applied. With the current embodiments of the invention, the damage to the features on the substrate surface is overcome by fine-tuning the frequency of the acoustic energy applied to each of the substrate and the liquid medium so that the combined energy helps in releasing the contaminants from the substrate without damaging the features formed on the substrate.

FIG. 2A illustrates another embodiment of the invention, wherein a head assembly is used to apply acoustic energy for cleaning the surface of the substrate 100. FIG. 2A illustrates a side view of a system that uses a dispense head, 106a, to apply a liquid medium as a meniscus to the surface of the substrate. In this embodiment, the dispense head, 106a, is provided to apply a meniscus of the liquid medium on a top surface of the substrate 100. A rinse head, 106c may be provided for subsequent rinsing and drying of the surface of the substrate 100. In one embodiment, the dispense head and rinse head are proximity heads as the heads are placed in an orientation that allow the heads to be spaced apart yet close to the surface of the substrate 100. In one embodiment, the close proximity distance is about 0.1 mm to about 3 mm and preferably between about 0.3-1 mm. The dispense head assembly 106a illustrated in FIG. 2A is exemplary, and any other suitable type of configuration to clean the substrate using acoustic energy may be utilized. Further, the geometry of the dispense head 106a and rinse head 106c of FIG. 2A, is configured such that it covers a portion of the surface of the substrate 100. In one embodiment, the dispense head and rinse head are stationary and the substrate is moved along an axis. In one embodiment, the substrate is received, supported and moved linearly along an axis by a carrier so that the surface of the substrate is substantially exposed to the liquid medium during cleaning process and to a liquid or liquid chemical, such as rinse chemical, during rinsing and drying process. In another embodiment, spin heads may be used dispense the liquid medium and to apply the acoustic energy to the substrate and liquid medium. In this embodiment, the substrate is mounted on a carrier, such as a chuck, and spun around an axis so that the surface of the substrate is substantially exposed to the liquid medium and the rinse chemical supplied by the dispense and the rinse heads, respectively. The size and shape of the substrate 100 may also vary and the dispense head 106a and rinse head 106c are appropriately configured to substantially clean the surface of the substrate 100. In another embodiment, the dispense head and rinse head may be mobile and the substrate may be stationary or may move relative to the movement of the dispense and rinse heads.

The liquid medium is carefully chosen so that the chemical structure can at least partially connect or interact thereby enabling quick capture of the particles as it breaks away from the surface of the substrate. The liquid medium is a viscous liquid that is made of long polymer chains. The liquid medium is applied by the dispense head 106a such that a thin meniscus of liquid medium is applied to a portion of the substrate surface that is exposed to the dispense head. The thickness of the thin meniscus of liquid medium may be about 0.1 mm to about 2 mm with an optimal thickness of about 0.5 mm.

The cleaning process begins with the application of the meniscus of liquid medium to the substrate surface as the substrate is moved under the dispense head, 106a, by a carrier (not shown). The carrier can be any conventional carrier that can receive, support and move the substrate along an axis. Upon applying the liquid medium as a meniscus, the substrate is moved under the rinse head, 106c, wherein one or more transducers, T1, T2, are used to apply acoustic energy to the substrate and the liquid medium. One or more inlet conduits 106c-1 in the rinse head 106c, are used in introducing rinse chemical to the substrate after the cleaning operation to rinse the surface of the substrate. One or more outlet conduits within the rinse head are used to promptly remove the liquid medium and the rinse chemical applied to the substrate. The liquid medium is left on the surface of the substrate from the time it is introduced by the dispense head 106a till it is removed by the rinse head 106c. The time the liquid medium is left on the surface of the substrate during the cleaning process is based on the distance between the dispense head and the rinse head and by the speed of movement of the substrate. If "d" is the distance between the dispense head and the rinse head and "w" is the relative speed of the substrate, then the residence time of the liquid medium on the surface of the substrate during the cleaning process is described as a function, fn(w,d). The residence time of the liquid medium may be adjusted by adjusting the distance "d" between the dispense head and the rinse head and by adjusting the speed of the substrate "w" so that optimal cleaning of the surface of the substrate is accomplished.

The rinse head 106c includes one or more transducers that are used in applying acoustic energy to the substrate and the liquid medium. The application of the acoustic energy to the substrate and the liquid medium is now explained in detail with reference to FIG. 2B. FIG. 2B illustrates an explosive view of a portion of the cleaning system used in cleaning the substrate. Upon application of the liquid medium to the surface of the substrate as a meniscus 116, the substrate is moved under the rinse head, 106c. The liquid medium meniscus 116 is substantially liquid at the delivery point and its viscosity might change as it moves away from the delivery point. As the liquid medium is viscous, the meniscus 116 of liquid medium has to be removed in order to prevent the liquid medium from adhering to the surface of the substrate. An outlet conduit in the rinse head enables the prompt removal of the liquid medium from the substrate surface. Although one outlet conduit is depicted in FIG. 2B, it should be understood that the rinse head may include a plurality of outlet conduits to help in the prompt removal of the liquid medium from the surface of the substrate. The rinse head 106c also includes an inlet conduit to introduce a liquid or liquid chemical, such as rinse chemical, to rinse the surface of the substrate after the cleaning process.

A transducer, T1 406, in the rinse head is used to introduce acoustic energy to the substrate and the liquid medium. The transducer, T1, includes a transducer body 406b and a piezo electric element 406a that is connected to a power supply 408. The power supply 408 could be any type of power-supply, such as radio-frequency power supply. The transducer, T1, is located close to the bottom surface of the rinse head facing the top surface of the substrate such that acoustic energy generated at the transducer is transferred without substantial loss in strength. The transducer body 406b receives the power from the power-supply 408 through the piezo electric element 406a and converts the power into acoustic energy, as shown by bubble 1. The acoustic energy is then transmitted to the rinse chemical supplied by the rinse head 106c as a meniscus, as shown by bubble 2. The rinse chemical acts as a couplant and transmits the acoustic energy to the substrate 100, as can be seen by the transmission arrows towards the substrate and by bubble 3. The substrate receives the acoustic energy from the transducer, T1, through the rinse chemical meniscus and starts vibrating. Due to the viscous nature of the liquid medium, the application of the acoustic energy is better effectuated when applied near the delivery point under the dispense head. The applied acoustic energy at the substrate and within the liquid medium work simultaneously in releasing the particle contaminants from the surface of the substrate. The released contaminants at least partially connect or interact with the liquid medium and are promptly removed through the outlet conduit. The acoustic energy applied to the surface of the substrate and the liquid medium may be fine-tuned based on the contaminants structure, size and the type of substrate-contaminant interaction.

In one embodiment, the transducer, T1, has a linear design that covers the length of the rinse head 106c. In this embodiment, the rinse head 106c includes an inlet conduit to supply the rinse chemical and an outlet conduit to remove the rinse chemical and the liquid medium after the cleaning process. The transducer, T1, is configured to substantially cover the length of the rinse head 106c without covering the inlet conduit or the outlet conduit. The transducer T1 is configured to provide uniform acoustic energy to the substrate and the liquid medium.

Figure 2C:
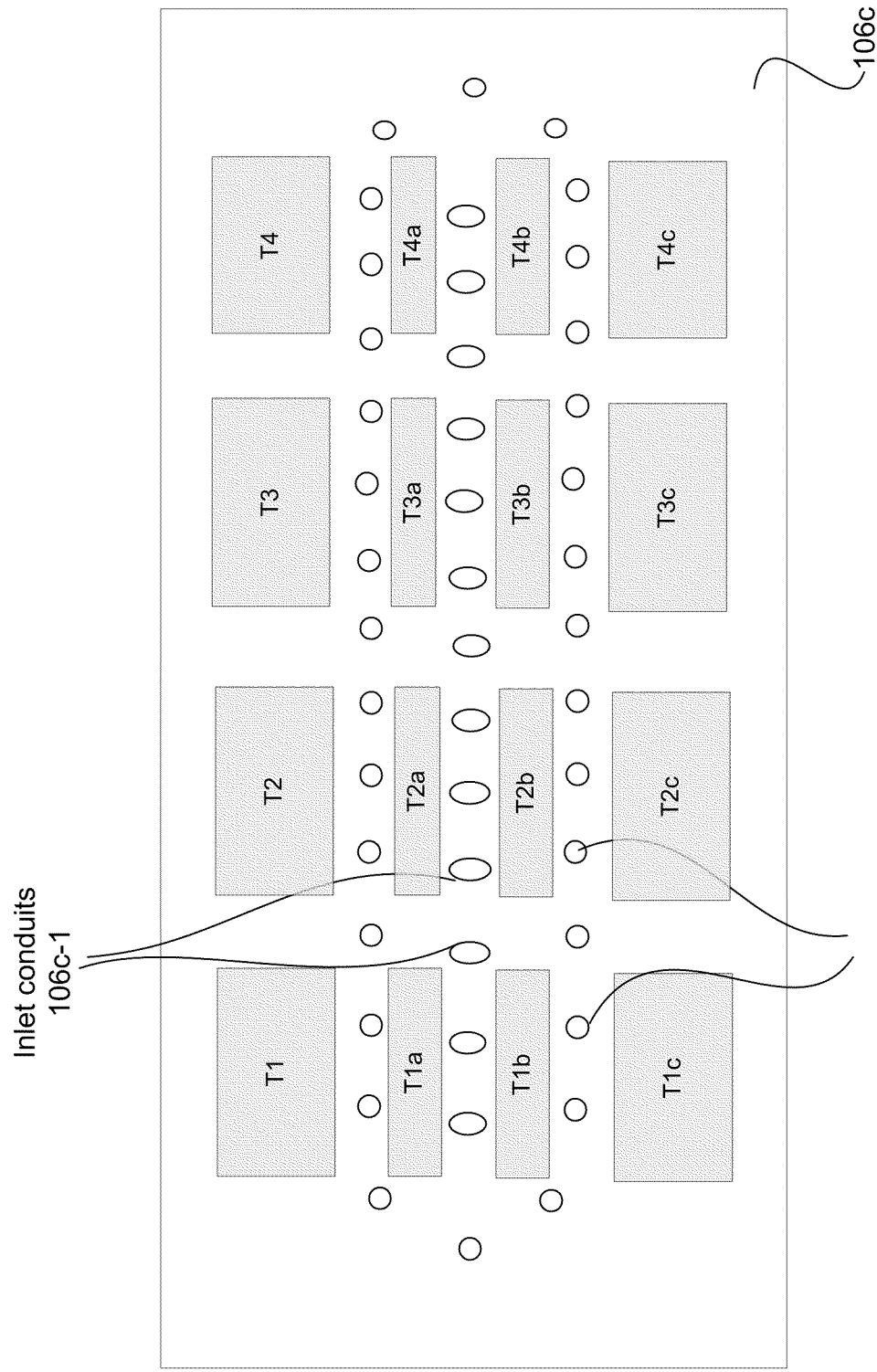
FIG. 2C illustrates a substrate cleaning system having a plurality of transducers to apply acoustic energy to the substrate and liquid medium, in one embodiment of the invention.

FIG. 2C illustrates an embodiment wherein a plurality of transducers, T1, T1a, T1b, T1c, T2, T2a, T2b, T2c, etc., are included in the rinse head 106c. The multiple transducers T1, T1a, T1b, T1c, T2, T3, T4, etc., are used in applying the acoustic energy uniformly to the liquid medium and through out the substrate 100. The rinse head 106c includes a plurality of inlet conduits 106c-1 to supply the rinse chemical to the substrate and a plurality of outlet conduits 106c-2 to remove the liquid medium and the rinse chemical from the surface of the substrate 100. The outlet conduits 106c-2 may be connected to a vacuum port so that a vacuum may be applied to remove the liquid medium, the particle contaminants and the rinse chemical from the substrate surface during the cleaning operation. In this embodiment, the plurality of transducers are linearly arranged to cover the surface of the rinse head 106c such that the application area for the acoustic energy covers the entire portion of the substrate exposed to the rinse head 106c. Furthermore, the transducers are arranged in the rinse head such that the location of the transducers does not cover any of the inlet or outlet conduits. In one embodiment, the plurality of transducers are configured to operate in a single frequency mode so as to provide uniform acoustic energy to the substrate and the liquid medium.

In an alternate embodiment, the plurality of transducers, T1, T1a, T1b, T1c, T2, T2a, etc., may be configured to operate in multi-frequency mode to enhance the uniformity of the acoustic energy applied to the substrate and the liquid medium and, hence, the cleaning efficiency. The acoustic energy generated by the plurality of transducers may be fine tuned to further ensure uniform application of the acoustic energy to the substrate and the liquid medium. For instance, some of the transducers (acoustic actuators) may be configured to work at a certain frequency while other transducers may be configured to work at a different frequency. The frequency at the transducers may be controlled through the sensors at the piezo electric element. Alternatively, the sensors at the piezo electric element may all be configured to work at several frequencies at the same time or any combination of both frequencies.

Figure 2D:
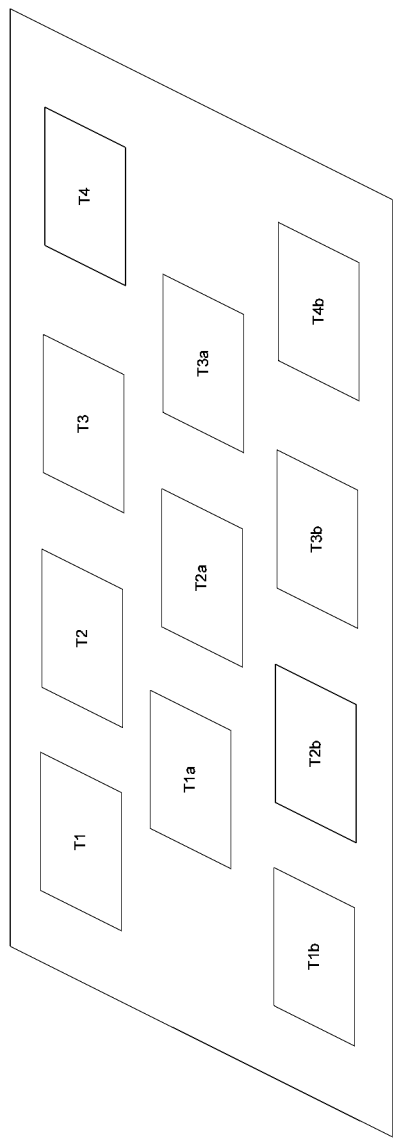
FIG. 2D illustrates a side view of the substrate cleaning system with plurality of transducers for application of the acoustic energy on the substrate, in an alternate embodiment of the invention.

FIG. 2D illustrates a simplified block diagram of a rinse head 106c housing a plurality of transducers, in an alternate embodiment of the invention. In this embodiment, the plurality of transducers are arranged in such a way that the acoustic energy application area of each transducer overlaps with that of another so that an entire portion of the surface of the substrate exposed to the rinse head receives uniform acoustic energy from the plurality of transducers.

Figure 2E:
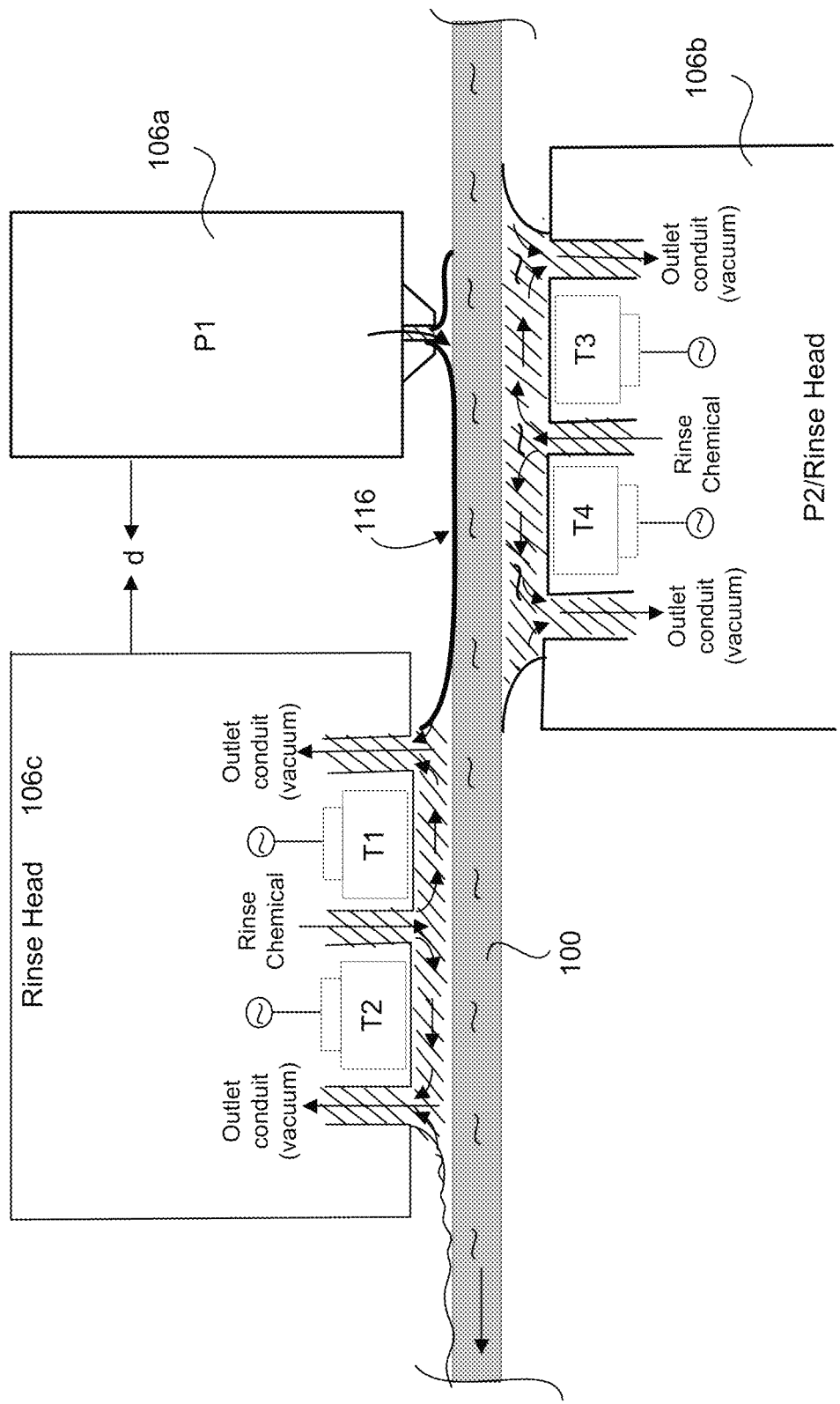
FIG. 2E illustrates an alternate embodiment of a substrate cleaning system shown in FIG. 2A with dual dispense heads lined on either side of the substrate.

In an alternate embodiment, in addition to a first rinse head 106c, a second rinse head 106b is provided to the underside of the substrate 100, as illustrated in FIG. 2E. As shown, the second rinse head 106b includes an inlet conduit to provide a meniscus 116 of a couplant, such as a rinse chemical, and a set of transducers T3, T4, etc., to provide additional acoustic energy to the couplant. In this embodiment, the couplant is the rinse chemical. The couplant acts as a medium for transmitting the acoustic energy from the transducers T3 and T4 to the substrate 100 from the substrate's underside. The dispense head 106a provides the liquid medium as a meniscus to the top surface of the substrate 100 and the transducers T1, T2, etc., in the rinse head 106c provides the acoustic energy to the substrate 100 from the top side. The acoustic energy applied to the substrate from both the top side and the underside are used in applying the acoustic energy to the liquid medium such that the acoustic energy introduced into the liquid medium as an acoustic wave does not generate cavitation. The embodiment illustrated in FIG. 2E is exemplary and any number of dispense heads, rinse heads and transducers may be used in any configuration so long as the functionality of the invention is maintained. It should be noted that the configuration and orientation of the rinse heads of FIGS. 2A-2E are exemplary and should not be considered limiting. In one embodiment, only the rinse head 106b may be used to provide the acoustic energy and rinse chemistry to the substrate from the underside and to remove the rinse chemistry and liquid medium after the cleaning process. In another embodiment, the rinse heads 106b and 106c may be configured to supply rinse chemistry and acoustic energy to the top surface of the substrate. In another embodiment, additional rinse heads may be used to supply the rinse chemistry and/or acoustic energy from the top surface, underside or both sides of the substrate.

The embodiments have been described with one or more transducers being located within the rinse head(s). However, these embodiments are exemplary and should not be considered limiting. In one embodiment of the invention, the transducer(s) may be disposed in a dispense head. In this embodiment, the transducers are located such that they are positioned after the inlet conduits that supply the liquid medium to the substrate 100 so that an acoustic energy generated from the transducers are transmitted to the liquid medium and the substrate 100. In another embodiment, the transducer T1 may be disposed on a separate head. In this embodiment, the head with the transducer T1 is located after the dispense head so that the acoustic energy generated by the transducer T1 are applied to the substrate and the liquid medium. An optional rinse head may be provided after the head with the transducer T1 so that the liquid medium with captured particles may be substantially removed from the surface of the substrate leaving behind a substantially clean substrate 100.

The plurality of transducers is used to generate uniform acoustic energy to the liquid medium and the substrate 100 during the cleaning process. The dispense head 106a is configured to deliver the liquid medium from a reservoir (not shown) to the substrate as a meniscus 116 through one or more inlet conduits and the transducers are positioned proximate to the surface of the rinse heads opposite to the respective surface of the substrate and do not cover any of the inlet or outlet conduits. The meniscus 116 substantially covers a portion of the surface of the substrate exposed to the dispense head 106a.

The transducers T1, T2, T3, T4 (406) are powered from an external power supply 408. In one embodiment, the external power supply may be a radio frequency (RF) power supply. The power from the power supply 408 is converted by the transducers 406 into acoustic energy which is applied to the substrate 100 and the meniscus 116 of the liquid medium. It should be appreciated that the transducer 406 may have any suitable configuration that would enable the conversion of RF to acoustic energy.

In one embodiment, the transducer 406 may be coated with a substance such as, for example, Teflon to protect the piezo electric crystal 406a and the transducer body 406b of the transducer 406 from the liquid medium and any other couplant meniscus 116 and contaminants that may exist on the surface of the substrate 100 being cleaned. The power from the power supply 408 is chosen such that the acoustic energy supplied to the liquid medium meniscus 116 does not provide cavitation in the meniscus 116. In one embodiment, the inlet and outlet conduits of the rinse heads 106b, 106c, are positioned such that the location of the inlet conduits supplying the rinse chemical are between the transducers and are not blocked by the transducers. The outlet conduits used to promptly remove the liquid medium along with the contaminants released from the substrate are connected to a vacuum port (not shown) which provides the suction for removing the liquid medium.

In one embodiment, by promptly removing the meniscus, re-adhesion of contaminants just released from the substrate is avoided and damage to features due to prolonged exposure to the liquid medium is prevented. The chemical structure of the liquid medium enables faster removal of the contaminants thereby deterring the contaminants to re-adhere to the substrate 100. The prompt removal of the liquid medium also prevents the liquid medium from adhering to the surface of the substrate due to the viscosity of the liquid medium. It should be noted that the exposure time of the liquid medium to the contaminants may be adjusted such that optimal amount of contaminants are removed from the surface of the substrate 100. The dispense head 106a, and rinse heads 106b, 106c are located such that the area of the meniscus applied at the surface of the substrate 100 substantially overlaps the area over which the acoustic energy is applied. It should also be understood that any suitable number of inlet conduits and outlet conduits may be utilized depending on the configuration of the apparatus and the meniscus size and shape desired.

In the presence of the acoustic energy, the targeted contaminants, which are adsorbed on the substrate, experience a force due to the difference in acoustic behavior of the liquid medium and the substrate. The force will dislodge the contaminants from the substrate. The dislodged contaminants at least partially connect or interact with the liquid medium and are removed along with the liquid medium through the outlet conduits. In one embodiment, the transducers, T1, T2, T3, T4, etc., are selected so as to provide equal and uniform acoustic energy to the substrate and the liquid medium. Even if the acoustic energy applied by the transducers T1, T2, T3, T4, are the same, the resulting acoustic energy within the liquid medium and substrate may differ from each other. This may be attributed to the difference in the intrinsic properties of the two media (substrate and liquid medium) which result in different acoustic behaviors within the two media. In another embodiment, acoustic energy generated by T1 and T2 are different from the acoustic energy generated by the transducers T3 and T4.

With the combined acoustic energy at the substrate and the liquid medium, the substrate and the liquid medium work together to release the contaminants from the surface of the substrate 100 without damaging the features. The amount of acoustic power delivery to the interface and the particles can be controlled by selecting appropriate transducers and by varying couplants through which the acoustic energy is transmitted to the substrate and the liquid medium based on the impedance matching. The usage of multiple transducers helps in controlling and maintaining the acoustic wave displacement uniformity within the liquid medium. The combination of the acoustic energy also enables using smaller acoustic energy and the application of the acoustic energy to both the substrate and the liquid medium provide a better cleaning result than the traditional megasonic cleaning operations which applies megasonic acoustic energy directly to the liquid medium to release the contaminants.

The combined acoustic energy applied to the surface and the liquid medium may produce waves of frequency of about 10 kHz-10 MHz. The acoustic energy applied to the liquid medium meniscus is carefully chosen so as to prevent cavitation while providing the optimal acoustic energy to the meniscus and substrate for removal of contaminants. By preventing cavitation, the additional energy released by the collapse of the bubbles during cavitation is avoided. Further, the acoustic energy applied to the substrate enables maximum wave displacement for acoustic waves introduced into the liquid medium which, in turn, aids in the efficient removal of contaminants from the surface of the substrate 100 without damaging the features formed on the substrate surface.

The geometry of the transducer(s) provided at the dispense heads and rinse heads are chosen to fit the geometry of the corresponding heads housing the transducer(s). As mentioned earlier, the current embodiments are exemplary and any other configurations may be used to enable the dispense head 106a in combination with rinse heads, 106b, 106c, etc., to be proximal to the substrate so that a meniscus of a liquid medium may be generated and applied in a controlled manner to the surface of the substrate and an appropriate acoustic energy is generated and applied to the meniscus and the substrate during the cleaning process.

The acoustic energy generated by the transducers may be tuned by adjusting the power supply to the transducers based on the size, composition and type of contaminants, type, thickness, width and composition of the substrate, type, composition and properties of the liquid medium. The liquid medium, in turn, is selected based on the nature, type and size of contaminants, substrate type and composition so that the application of the first liquid medium does not degrade the features on the substrate or any of the components used in the cleaning process. In one embodiment, the first liquid medium that is applied as a meniscus is partially hydrolyzed polyacrylamide. Any other suitable liquid medium with chemical structure that may enable bonding with the contaminants may be used in place or in combination with the partially hydrolyzed polyacrylamide. The rinse chemical used to rinse and dry the substrate after the cleaning operation may be deionized water (DIW). The rinse chemical is exemplary and the embodiments may use any other rinse chemical in place or in combination with DIW.

For more information on proximity heads, orientation and configuration of proximity heads, configuration and functions of arm assembly, and transducers within proximity heads for cleaning using acoustic energy, reference can be made to U.S. application Ser. No. 10/611,140 filed on Jun. 30, 2003, entitled "METHOD AND APPARATUS FOR CLEANING A SUBSTRATE USING MEGASONIC POWER" and assigned to the assignee of the current application, which is incorporated herein by reference.

The flow rate of the liquid medium to the surface of the substrate is controlled so as to maintain a layer of meniscus. In one embodiment, the flow rate of the liquid medium through an inlet in a dispense head 106a may vary depending on the size of the dispense head and may be between about 5 ml per minute or about 0.00177 standard cubic feet per hour (SCFH) to about 500 ml per minute or about 1.0549 SCFH with an optimal flow rate of about 100 ml per minute or about 0.22 SCFH. Similarly, the flow rate for the vacuum through an outlet of the same dispense head or a different dispense head may be adjusted according to the flow rate of the liquid medium and is maintained between about 100 standard liter per minute (SLM) to about 600 SLM with an optimal flow rate of about 500 SLM.

Figure 3A:
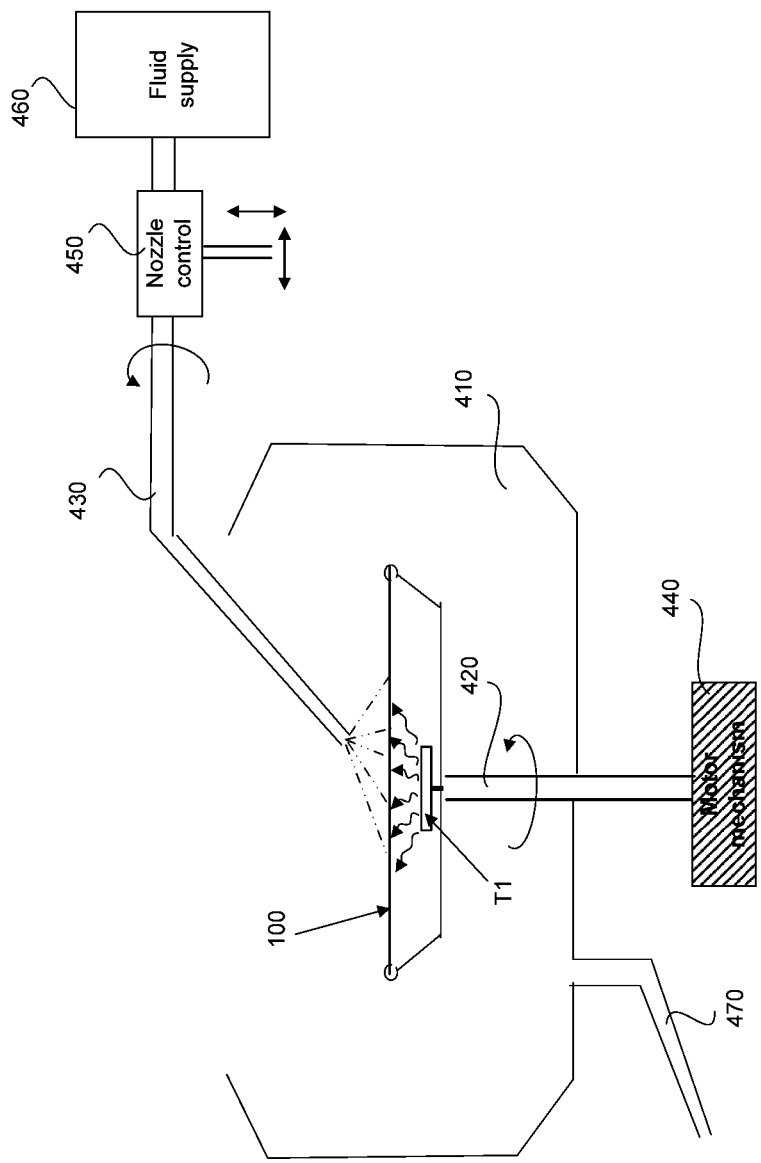
FIG. 3A illustrates a substrate cleaning system using a spin tool, in one embodiment of the invention.

FIGS. 3A through 3D illustrate alternate embodiments of the invention that uses a spin tool mechanism for cleaning the substrate. As shown in FIG. 3A, the spin tool mechanism includes a receptacle 410, such as a bowl, to receive and hold a liquid medium. The receptacle 410 includes an outlet port 470 to remove the liquid medium after cleaning process so that the liquid medium may be replenished in the receptacle 410. A carrier mechanism 420, such as a chuck, is configured to receive, support and move the substrate along an axis. The carrier mechanism 420 is connected to a motor mechanism 440 to provide the force to move the carrier mechanism 420 along an axis. A substrate 100 is supported on the carrier mechanism such that a thin layer of liquid medium in the receptacle covers the substrate surface. The carrier mechanism 420 further includes a transducer T1. The transducer T1 is connected to a power supply (not shown) and uses the power to generate acoustic energy that is applied to the substrate 100 and the liquid medium. In one embodiment, the acoustic energy is in the form of sound. The sound energy is transmitted to the substrate 100 and to the liquid medium on the surface of the substrate. A rinse mechanism 430, such as a nozzle, is used to provide rinse chemical to the surface of the substrate during the cleaning process. The rinse chemical may act as a couplant to receive and transmit the acoustic energy generated by the transducer T1 to the liquid medium. The rinse mechanism 430 is mounted on a moveable arm so that it can be moved up, down and sideways using a control mechanism 450, such as a nozzle control mechanism, so that the rinse mechanism 430 may be appropriately positioned over the substrate to provide uniform meniscus of rinse chemical to the surface of the substrate 100. The rinse mechanism 430 is, in turn, connected to a fluid supply source 460 that supplies the rinse chemical. In an alternate embodiment, the transducer T1 is located within the rinse mechanism such that it does not block any inlet conduit that supplies the liquid medium to the substrate surface. In this embodiment, the rinse mechanism 430 is not only connected to the fluid supply source 460, but also to the is also connected to a power supply so as to provide energy to the transducer T1.

In operation, the transducer uses the power from the power supply and converts the power into acoustic energy, such as sound energy. The acoustic energy is transmitted to the substrate supported on the carrier mechanism 420. Portion of the acoustic energy applied to the substrate 100 is transmitted to the liquid medium on the surface of the substrate as acoustic waves. It should be noted that the amount of acoustic energy supplied to the liquid medium is fine tuned so as to prevent cavitation within the liquid medium. The acoustic energy to the substrate enables the substrate to vibrate. The combined acoustic energy at the substrate and the liquid medium work towards overcoming the adhesive force between the particle contaminant and the substrate surface thereby releasing the particle contaminants. The released contaminants are removed along with the liquid medium resulting in a substantially clean surface. The rinse chemical may be used to further clean the substrate surface after the cleaning process.

The embodiment illustrated in FIG. 3A is exemplary and should not be considered limiting. In one embodiment, the transducer T1 may be replaced by a plurality of transducers configured to provide uniform acoustic energy to the substrate surface. In another embodiment, the plurality of transducers may be configured to operate in multi-frequency mode to further increase uniformity to the acoustic energy applied to the substrate for efficient cleaning.

FIG. 3B illustrates an alternate configuration of a spin tool illustrated in FIG. 3A. In this embodiment, the transducer T1 is provided on a moveable arm 480 instead of within the carrier mechanism. The moveable arm 480 is configured to move up, down and sideways so that the position of the transducer T1 may be adjusted to provide uniform acoustic energy to the substrate and the liquid medium. The moveable arm 480 is connected to a power supply so that the transducer can use the power to provide acoustic energy to the substrate and the liquid medium. In one embodiment, the acoustic energy is in the form of sound energy. The rinse mechanism 430 is used to supply rinse chemical to the substrate 100 over which a meniscus of liquid medium is applied. During operation, acoustic energy from the transducer T1 is applied to the rinse chemical. The rinse chemical acts as a couplant and transmits the acoustic energy to the liquid medium and the substrate 100. The acoustic energy applied to the substrate 100 and liquid medium enables the substrate 100 to vibrate and introduces an acoustic wave within the liquid medium. The acoustic energy from the substrate and the liquid medium work together to release the particle from the substrate by overcoming the adhesive force. The released particles are removed along with the liquid medium from the substrate surface leaving behind a substantially clean substrate. In an alternate embodiment, the moveable arm 480 may include inlet conduits to supply liquid medium to the substrate. In this embodiment, the transducer T1 may be provided such that the transducer T1 does not cover the inlet conduit that supplies the liquid medium. The function of the transducer T1 is similar to the embodiment discussed with reference to FIG. 3B.

FIG. 3C illustrates the operation of the rinse mechanism 430 and the moveable arm 480 with the transducer T1 illustrated in FIG. 3B, in one embodiment of the invention. In this embodiment, the carrier mechanism with the substrate 100 is configured to rotate along an axis using a motor mechanism 440 shown in FIG. 3B. The rinse mechanism 430 is originally positioned at the center of the substrate 100 and slowly moved towards the outer edge of the substrate 100 while the substrate is spun around the axis by the carrier mechanism 420. As the rinse mechanism 430 moves outward, the centrifugal force pushes the liquid medium and the rinse chemical toward the outer periphery thereby cleaning the substrate from the center outwards. The moveable arm 480 with the transducer T1 is positioned near the center proximate to the rinse mechanism 430 and slowly moved towards the outer periphery of the substrate 100, as shown in FIG. 3B. The acoustic energy from the transducer T1 is applied to the liquid medium and the substrate 100 through the rinse chemical supplied by the rinse mechanism 430 and acts together to release the particles from the substrate surface. The released particle connect with the liquid medium and are removed from the substrate surface through the centrifugal force acting at the substrate surface. The location of the rinse mechanism 430 and the moveable arm 480 are to be considered exemplary and other configurations may also be considered so long as the functionality of the invention is satisfied.

Figure 3D:
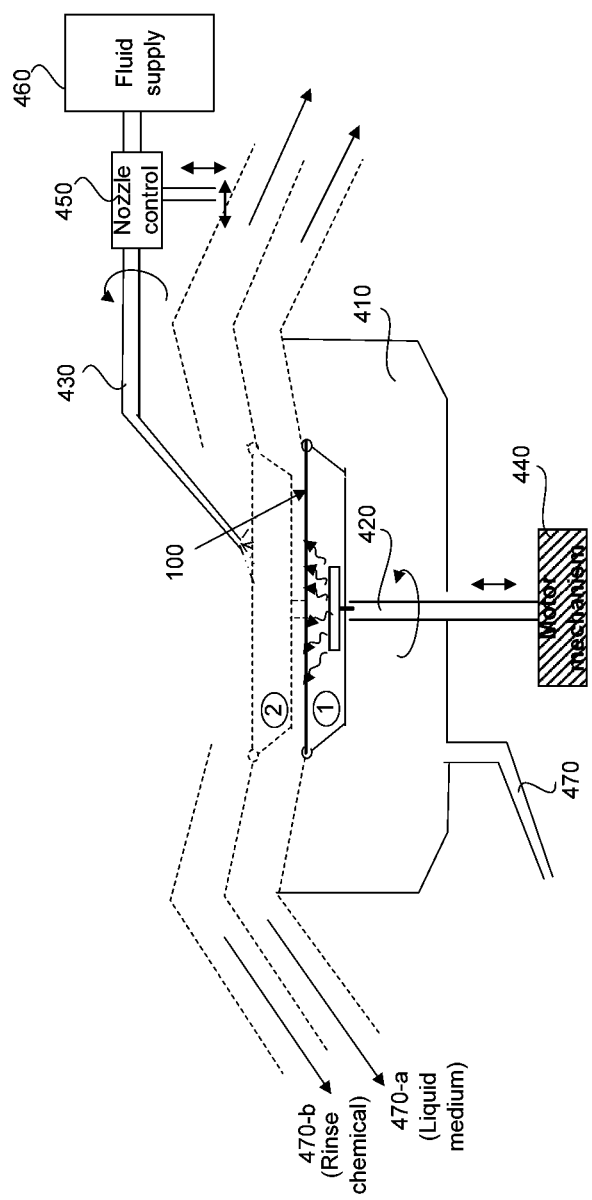
FIG. 3D illustrates an alternate embodiment of a spin tool mechanism illustrated in FIGS. 3A and 3B.

FIG. 3D illustrate an alternate embodiment of a spin tool mechanism. In this embodiment, the carrier mechanism 420 is configured to not only rotate along an axis but is also configured to move up and down. This configuration enables the substrate received on the carrier mechanism 420 to be moved up and down and about an axis of rotation so that different fabrication operations such as cleaning and rinsing can be performed without having to move the substrate from one receptacle to another. The receptacle 410 is configured to provide an outlet for the liquid medium 470-$a$ and for the rinse chemical 470-$b$ during the cleaning and rinsing process so that the liquid medium and rinse chemical may be recycled. The outlets 470-$a$ and 470-$b$ are connected to corresponding receptacles to receive the liquid medium and the rinse chemical respectively, after the cleaning and rinsing process. Towards this end, the carrier mechanism 420 positions the substrate 100 first at location 1 so that the liquid medium substantially covers the surface of the substrate as a thin film. After the cleaning process, the liquid medium along with the particles are efficiently removed through the first outlet 470-$a$ and collected in the liquid medium receptacle. The carrier mechanism is then raised to location 2 wherein the substrate 100 is treated with the rinse chemical from the rinsing mechanism 430. Upon completion of the rinsing process, the rinse chemical is removed through the outlet 470-$b$ and collected in the rinse chemical receptacle. Based on the type of the chemicals used, the chemicals may be recycled. The acoustic energy may be supplied through a transducer T1 within the carrier mechanism, as shown in FIG. 3D or may be supplied through a transducer T1 located in a moveable arm 480, as shown in FIG. 3B. The acoustic energy at the substrate and the liquid medium work together to release the particles from the surface of the substrate. The released particles at least partially connect with the liquid medium and are removed from the substrate after the cleaning process leaving behind a substantially clean surface.

Figure 4A:
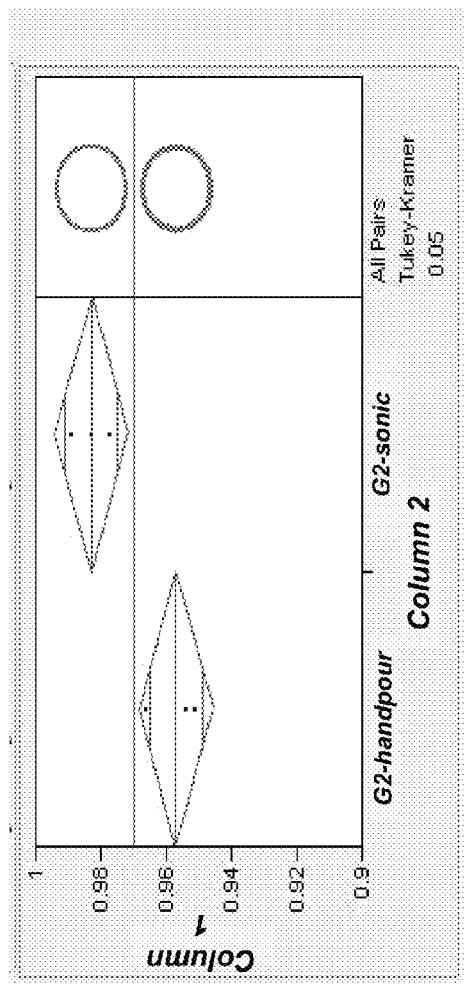
FIGS. 4A and 4B illustrate a particle removal efficiency data graph comparing results from a handpour application against a sonic application, in accordance with one embodiment of the invention.
Figure 4B:
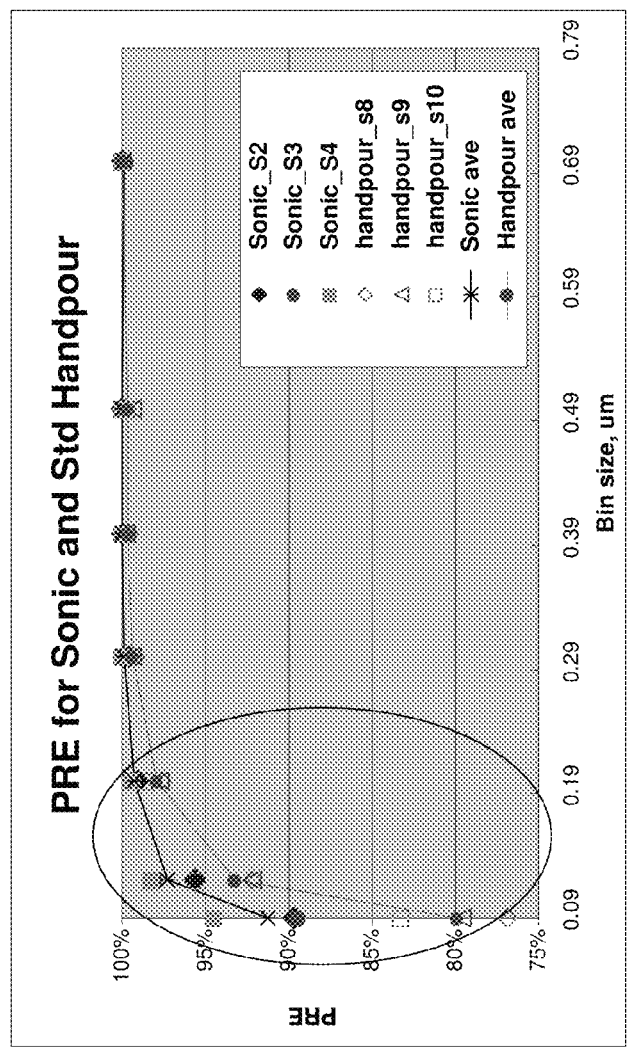

FIGS. 4A and 4B illustrate a particle removal efficiency data graph comparing results from a handpour application against a sonic application, in accordance with one embodiment of the invention. As can be seen in FIG. 4A, the particle removal efficiency for an acoustic energy application is substantially higher than that obtained from a handpour application. In one embodiment, the particle removal efficiency (PRE) shows an improvement of almost about 16-18%, as can be seen in FIG. 4B.

Figures 5A, 5B:
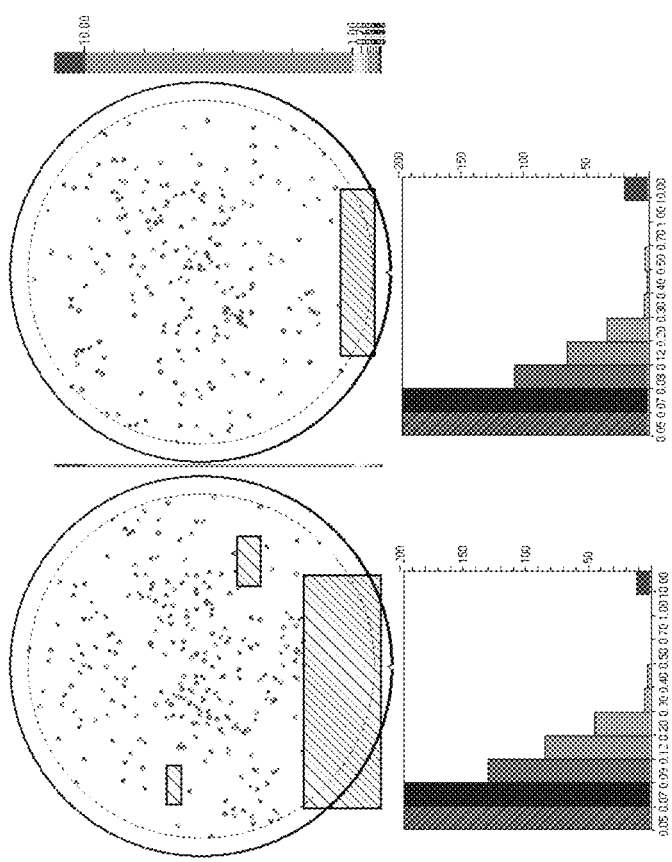
FIGS. 5A and 5B illustrate post process particle map associated with sonic assisted cleaning technique and standard handpour cleaning technique, in one embodiment of the present invention.

FIGS. 5A and 5B illustrate post process particle map distribution associated with sonic assisted cleaning technique and standard handpour cleaning technique, in one embodiment of the invention. As can be seen, the amount of contaminants per unit area is substantially less in sonic application as compared to a standard handpour application. Additionally, it can be seen that the particles were removed fairly evenly on substrate surface using acoustic energy as compared to the standard handpour and the particle maps show no non-uniformity issue associated with the distribution of contaminants on the surface of the substrate after undergoing sonic application.

Figure 6:
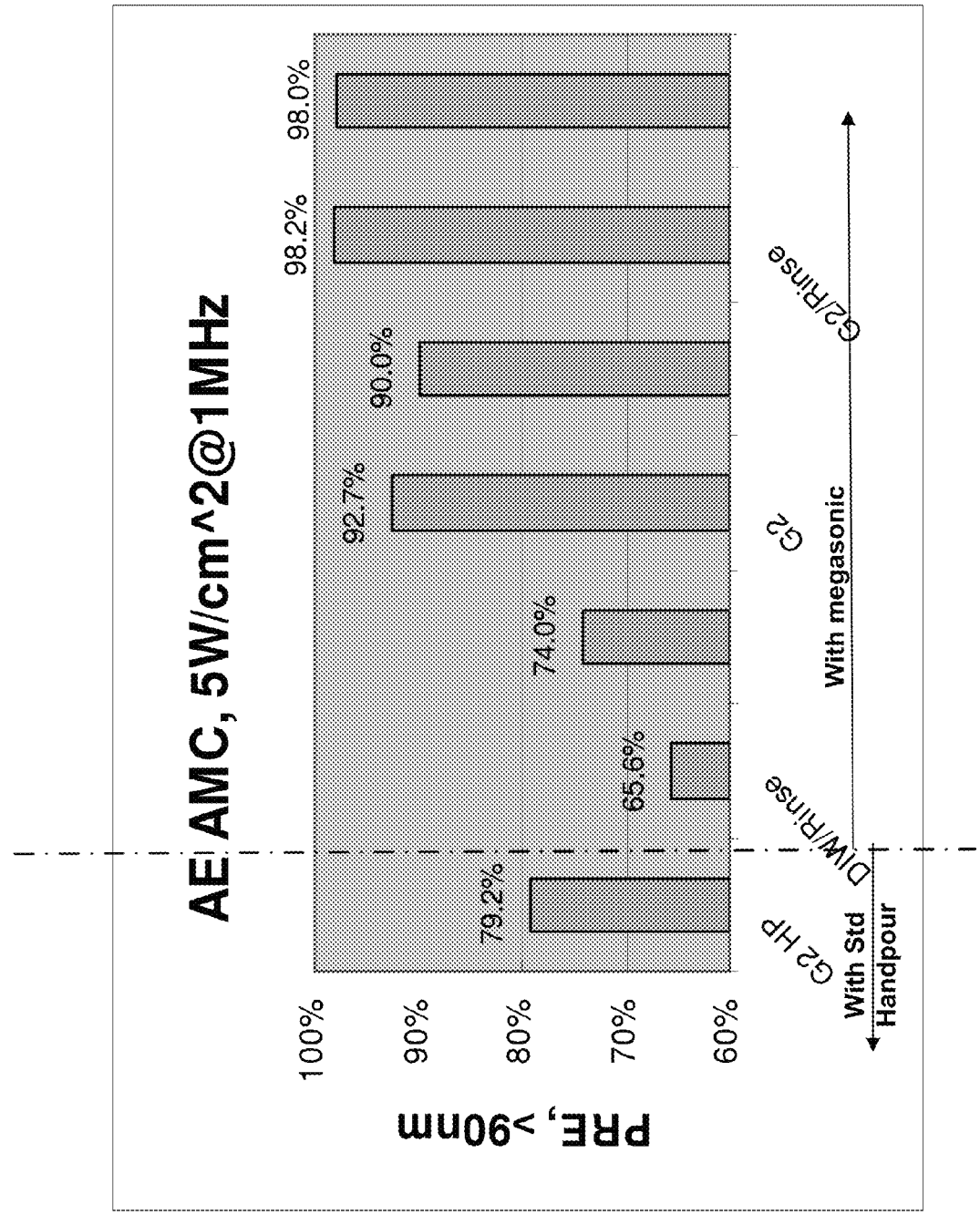
FIG. 6 illustrate particle removal efficiency bar graph associated with standard handpour application and megasonic acoustic energy application, in one embodiment of the invention.

FIG. 6 illustrate particle removal efficiency (PRE) bar graph associated with standard handpour application and megasonic acoustic energy application, in one embodiment of the invention. As can be seen, the PRE using a liquid medium for a standard handpour application, (for example, a liquid medium chemical, such as partially hydrolyzed polyacrylamide) shows about 79% efficiency for contaminants with dimensions greater than 90 nanometers (nm). The PRE for a sonic application as shown varies with varied power of acoustic energy applied to the surface with marked improvement shown when a combined acoustic energy of 5 W/cm$^2$ is applied to the surface of the substrate and the liquid medium. As shown, the PRE improved from about 79% efficiency to about 98% efficiency. However, it should be understood that the acoustic energy must be carefully selected so as to obtain high PRE while ensuring damages are not introduced into the features formed on the substrate. Such damages may be due to cavitation. Thus, application of acoustic energy and appropriate selection of liquid medium are carefully monitored to enable optimal particle removal efficiency while preventing cavitation and preserving attributes of features formed on the substrate.

FIGS. 7A through 7C illustrate damage data associated with acoustic energy of 1 MHz at different power levels applied during the cleaning process, in one embodiment of the invention. As can be seen, the power level associated with the acoustic energy applied to the substrate greatly determines the amount of damage introduced on the substrate with higher particle removal efficiency (PRE). With an acoustic energy (AE) power of 5 W/cm$^2$ applied to the substrate-liquid medium-contaminant interface approximately 30,000 damages were introduced while improving PRE by about 18%, as illustrated in FIG. 7A. With AE power of 0.7 W/cm$^2$ about 500 damages were introduced, as illustrated in FIG. 7B and with AE power of 0.3 W/cm$^2$ about zero damages were introduced while still improving PRE by about 5%, as illustrated in FIG. 7C. The amount of AE introduced is optimized based on the amount of PRE desired while minimizing the amount of damages introduced at the substrate.

Figure 8A:
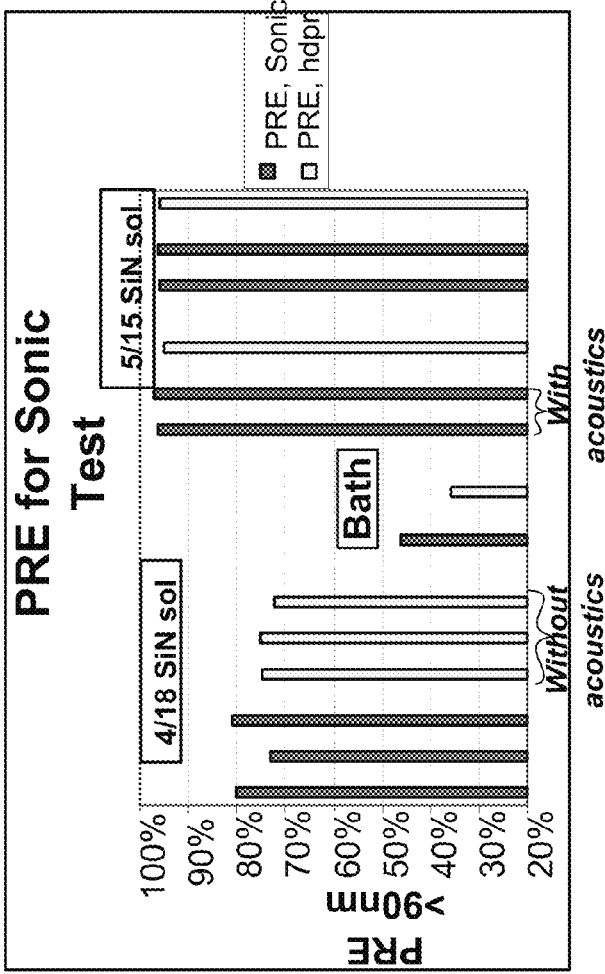
FIGS. 8A and 8B illustrates particle removal efficiency based on megasonic application test, in one embodiment of the invention.
Figure 8B:
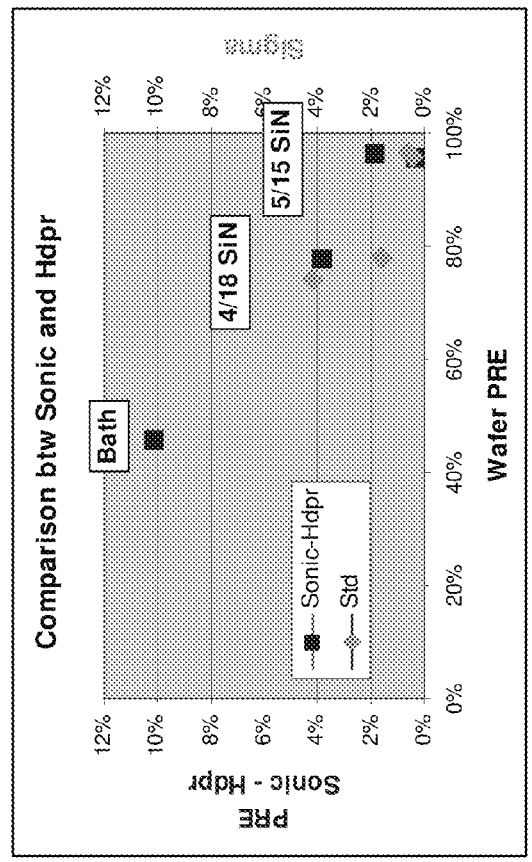

FIGS. 8A and 8B illustrates particle removal efficiency based on acoustic energy application test, in one embodiment of the invention. As shown, the introduction of acoustic energy may improve the PRE and the improvement depends on the original PRE that was already available from traditional cleaning process. As shown, at a lower PRE regime (40%) available, applying acoustic energy improves the PRE by about 10% from the traditional standard handpour cleaning process. At mid- or high-PRE regimes (80% and 95%), applying acoustic energy improves the PRE by about 4% and 1.5%, respectively, from the traditional handpour application. With the continued reduction in feature sizes, it is desirable to improve the PRE rate closer to 100% and the selection and application of appropriate acoustic energy enables one to achieve the desired PRE result.

Exemplary proximity heads and their respective configurations and patterns of the inlet conduits as well as the outlet conduits may be seen in U.S. patent application Ser. Nos. 10/261,839, 10/404,270, and 10/330,897 which have been incorporated herein by reference. Therefore, any, some, or all of the proximity heads described herein may be utilized in any suitable configuration for suitable substrate cleaning and drying. In addition, the proximity head may also have any suitable numbers or shapes of outlet conduits and inlet conduits. Moreover, the transducer 406 may be any suitable size, shape, and number as long the transducer 406 may apply acoustic energy to the substrate and introduce acoustic waves to the meniscus 116. It should be appreciated that the transducer 406 may be located in any suitable region of the rinse head 106*c*, or any suitable region of the dispense head 106*b*, etc., so long as the transducer 406 is capable of applying acoustic waves to the meniscus 116. Therefore, the transducer 406 may apply acoustic waves such as, for example, ultrasonic waves and/or megasonic waves to the meniscus 116 as described above in reference to FIGS. 2A through 2E and 3. Consequently, by use of appropriate liquid medium and acoustic energy, the cleaning of substrate surfaces may be intelligently optimized and enhanced.

The liquid medium is carefully selected based on chemical structure and composition. In one embodiment, a typical liquid medium that is used to clean the substrate having features that define integrated circuit devices, includes polymers, such as polyacrylamide (PAM), with a molecular weight greater than or equal to 500,000 g/mol. The liquid medium is defined as being in a substantial liquid phase. The liquid medium deforms around features formed on the surface of the substrate when a force due to the application of the acoustic energy is exerted on the liquid medium covering the substrate. The liquid medium is applied on the surface of the substrate to remove contaminants from the surface without substantially damaging the features on the surface. The liquid medium is substantially free of abrasive particles before the liquid medium is applied on the surface of the substrate. For more information on the liquid medium used for cleaning the substrate, reference can be made to U.S. Provisional Application No. 61/013,950 filed on Dec. 14, 2007, entitled "MATERIALS AND METHODS FOR PARTICLE REMOVAL BY SINGLE-PHASE AND TWO-PHASE MEDIA," assigned to the assignee of the instant application, which is incorporated herein by reference.

As mentioned above, the polymers of a polymeric compound with large molecular weight are dispersed in the liquid medium. Examples of the polymeric compound with large molecular weight include, but not limited to, acrylic polymers such as polyacrylamide (PAM), and polyacrylic acid (PAA), such as Carbopol 940™ and Carbopol 941™, poly-(N,N-dimethyl-acrylamide) (PDMAAm), poly-(N-isopropyl-acrylamide) (PIPAAm), polymethacrylic acid (PMAA), poly-methacrylamide (PMAAm); polyimines and oxides, such as polyethylene imine (PEI), polyethylene oxide (PEO), polypropylene oxide (PPO) etc; Vinyl polymers such as Polyvinyl alcohol (PVA), polyethylene sulphonic acid (PESA), polyvinylamine (PVAm), polyvinyl-pyrrolidone (PVP), poly-4-vinyl pyridine (P4VP), etc; cellulose derivatives such as methyl cellulose (MC), ethyl-cellulose (EC), hydroxyethyl cellulose (HEC), carboxymethyl cellulose (CMC), etc; polysaccharides such as acacia (Gum Arabic), agar and agarose, heparin, guar gum, xanthan gum, etc; proteins such as albumen, collagen, gluten, etc. To illustrate a few examples of the polymer structure, polyacrylamide is an acrylate polymer ($-CH_2CHCONH_2-$)n formed from acrylamide subunits. Polyvinyl alcohol is a polymer ($-CH_2CHOH-$)m formed from vinyl alcohol subunits. Polyacrylic acid is a polymer ($-CH_2=CH\_COOH-$)o formed from acrylic acid subunits. "n", "m", and "o" are integers. In one embodiment, the molecular weight of the polymeric compound is greater than 100,000 g/mol. In another embodiment, the molecular weight of the polymeric compound is between about 0.1M g/mol to about 100M g/mol. In another embodiment, the molecular weight of the polymeric compound is between about 1M g/mol to about 20M g/mol. In yet another embodiment, the molecular weight of the polymeric compound is between about 15M g/mol to about 20M g/mol.

In one embodiment, the attributes of the liquid medium that have enabled optimal removal of contaminants without damage to the features include a flow rate of about 5 ml per minute to about 500 ml per minute with an optimal flow rate of about 100 ml per minute, pressure of about 0 psi to about 50 psi. The optimal substrate to proximity head gap is between about 0.3 mm-about 3 mm with an optimal gap between about 0.5 mm-1 mm. The megasonic acoustic energy that has shown optimal result is between about 10 KHz to about 10 MHz. In the case of high frequency acoustic energy, the mechanism of application is through micro-streaming and cavitation. For lower frequency acoustic energy, the mechanism of application is different. At the low frequency, the acoustic energy is coupled to the liquid medium which causes it to respond to the acoustic wave as the frequency of acoustic energy applied is similar to that of the relaxation time. The acoustic energy that has shown optimal result at low frequency is between about 1 Hz to 1 KHz. In one embodiment, the frequency of acoustic energy is comparable to the reciprocal of a relaxation time of the liquid medium. For example, if the relaxation time of the liquid medium is 1 sec., the frequency of acoustic energy may be of the order of 1 Hz.

The liquid medium includes a solvent, and a buffering agent to change a potential of hydrogen (pH) value of the liquid medium. The buffering agent and the solvent form the liquid medium used in cleaning the substrate. The polymers become soluble in the liquid medium solvent. The resulting liquid medium has less than 1 ppb (parts per billion) metallic contaminants and pH value is between about 7 and about 12. The solubilized polymers have long polymer chains to at least partially connect or interact with the contaminants dislodged from the surface of the substrate and successfully entrapping them.

Figure 9:
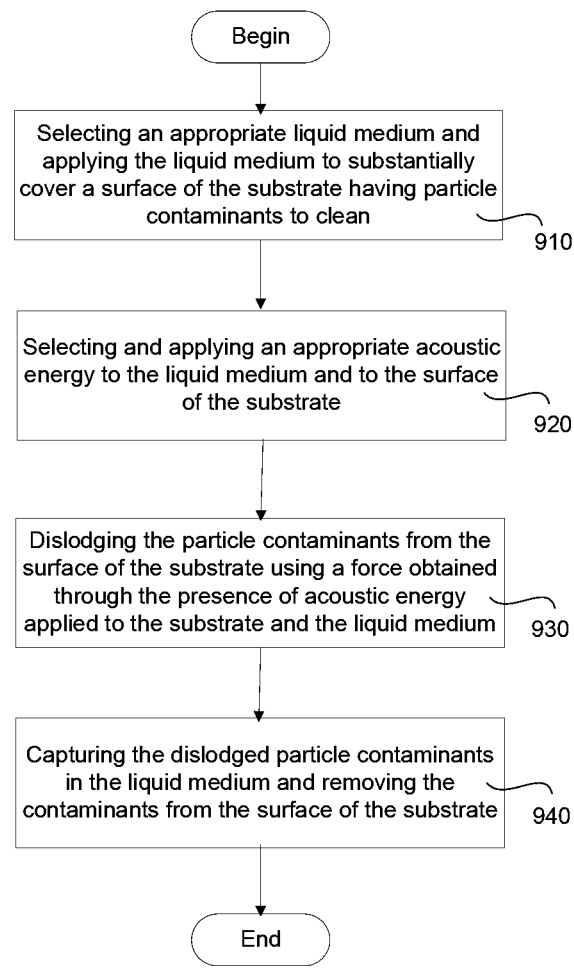
FIG. 9 illustrates a flow chart of operations involved in providing a megasonic acoustic energy to a substrate surface, in accordance with one embodiment of the invention.

A method for cleaning a substrate surface using acoustic energy will now be described with reference to FIG. 9. The method begins with the selection and application of a liquid medium so as to substantially cover a portion of a surface of the substrate, as illustrated in operation 910. The liquid medium may be provided as a liquid meniscus or provided in a tank with a cavity into which the substrate may be dipped so as to substantially cover the surface of the substrate. The liquid medium may be chosen such that the chemical structure enables at least partial connection or interaction with the contaminants released from the surface of the substrate. In one embodiment, a proximity head is used to introduce the liquid medium as a meniscus. An acoustic energy is applied to the liquid medium and the substrate through one or more transducers, as illustrated in operation 920. The transducers are selected such that they are capable of introducing the acoustic energy (AE) to the substrate and into the liquid medium through the substrate such that the acoustic energy does not cause any cavitation within the liquid medium and to provide maximum wave displacement to acoustic waves introduced into the liquid medium. In the presence of the AE, the target contaminants, which are adsorbed on the substrate, experience a force due to the difference in acoustic behavior of the liquid medium and the substrate. The difference in the acoustic behavior is due to the liquid medium and the substrate's intrinsic properties, such as sound velocity and the displacement amplitude. The combined force experienced by the contaminants help in dislodging the contaminants from the substrate, as illustrated in operation 930. The process concludes with the dislodged contaminants at least partially connecting or interacting with the liquid medium and being entrapped by the liquid medium and are promptly removed along with the liquid medium, as illustrated in operation 940. The process may continue with the cleaning of yet another substrate. Although, the embodiments have been described in detail for cleaning a single substrate, the current embodiments may be used to clean a batch of substrates.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for cleaning a semiconductor substrate, comprising:
   applying, using a dispense head, a liquid medium to a surface of the semiconductor substrate so as to substantially cover a portion of the surface of the semiconductor substrate being cleaned, the liquid medium made of long polymer chains and having a molecular weight between about 15M g/mol to about 100M g/mol; and
   applying an acoustic energy to the semiconductor substrate so as to enable the semiconductor substrate to vibrate, the semiconductor substrate having a plurality of particle contaminants to be removed, the vibration of the semiconductor substrate transferring the acoustic energy from the surface of the semiconductor substrate to the liquid medium so as to introduce an acoustic wave velocity in the liquid medium, the acoustic wave velocity in the liquid medium together with the acoustic energy applied at the semiconductor substrate creates unbalanced pressure waves at a liquid-contaminant-substrate interface, the unbalanced pressure waves exert a force on the liquid medium, the force on the liquid medium acts on the plurality of particle contaminants to overcome an adhesive force between the plurality of particle contaminants and the substrate surface thereby dislodging the plurality of particle contaminants from the surface of the semiconductor substrate, wherein the acoustic energy is tuned so that the acoustic wave velocity transferred from the semiconductor surface to the liquid medium does not produce cavitation within the liquid medium and wherein the polymer chains in the liquid medium capture and entrap the dislodged particle contaminants while preventing re-adhesion of the particle contaminants to the substrate surface;
   leaving the liquid medium on the surface of the substrate for a resident time while the acoustic energy is applied through the substrate; and
   after the resident time has occurred, removing the liquid medium with entrapped particle contaminants from the surface of the substrate with a rinse head that is separate from the dispense head, the rinse head and the dispense head being spaced apart,
   wherein the resident time is computed as a function of distance between the rinse head and the dispense head and relative speed of movement of the substrate under the dispense head and the rinse head.

2. The method of claim 1, wherein applying acoustic energy to the semiconductor substrate further comprising:
   selecting a transducer for generating acoustic energy; and
   generating the acoustic energy for applying to the semiconductor substrate using the transducer so as to provide maximum acoustic wave displacement in the liquid medium.

3. The method of claim 2, further comprising controlling the acoustic energy applied by the transducer so as to maintain acoustic wave displacement uniformity within the liquid medium and the semiconductor substrate.

4. The method of claim 1, further includes providing a second transducer, the second transducer coupled to an underside of the semiconductor substrate, the second transducer enabling application of acoustic energy to the semiconductor substrate from the underside through a couplant.

5. The method of claim 4, further includes,
   selecting the couplant having intrinsic properties that enable transmission of acoustic energy; and
   applying the couplant to the semiconductor substrate, the amount of acoustic energy delivered to the semiconductor substrate from the underside based on the intrinsic properties of the couplant.

6. The method of claim 5, wherein the acoustic energy applied to the semiconductor substrate and the liquid medium is based on intrinsic properties associated with the semiconductor substrate, the liquid medium and the couplant, the acoustic energy defining the acoustic behavior of the acoustic waves within the liquid medium.

7. The method of claim 6, wherein the intrinsic properties associated with the couplant and the liquid medium include any one or more of chemical composition, density, and temperature, and wherein the intrinsic properties associated with the semiconductor substrate include any one or more of composition, thickness, width, temperature, type of contaminants, size of contaminants, contaminant composition.

8. The method of claim 4, wherein the couplant is one of a liquid or a liquid chemical used in rinsing the semiconductor substrate.

9. The method of claim 1, further includes selecting the liquid medium such that chemical structure of the liquid medium enables at least partial connection or interaction with the particle contaminant released from the surface of the semiconductor substrate during the cleaning process and wherein the liquid medium is partially hydrolyzed polyacrylamide.

10. The method of claim 1, wherein the acoustic energy is applied to the semiconductor substrate and the liquid medium so as to have a frequency between about 10 KHz to about 10 MHz.

11. The method of claim 1, wherein the liquid medium is a polymer based liquid medium having a chemical structure made up on long polymer chains, the liquid medium includes at least partially hydrolyzed polyacrylamide.

12. The method of claim 1, wherein the acoustic energy is tuned so that the acoustic wave velocity in the liquid medium minimizes damage to features caused due to cavitation within the liquid medium.

13. The method of claim 1, wherein the resident time is dynamically adjusted by adjusting any one or both of, (a) the distance between the rinse head and the dispense head, and (b) the relative speed of movement of the substrate under the rinse head and the dispense head.

14. A method for cleaning a semiconductor substrate, comprising:
   applying, using a dispense head, a liquid medium to a surface of the semiconductor substrate so as to substantially cover a portion of the surface of the semiconductor substrate being cleaned, the liquid medium made of long polymer chains and having a molecular weight between about 15M g/mol to about 100M g/mol;

applying an acoustic energy to the semiconductor substrate so as to enable the semiconductor substrate to vibrate, the semiconductor substrate having a plurality of particle contaminants to be removed, the vibration of the semiconductor substrate transferring the acoustic energy from the surface of the semiconductor substrate to the liquid medium so as to introduce an acoustic wave velocity in the liquid medium, the acoustic wave velocity in the liquid medium together with the acoustic energy applied to the semiconductor substrate creates unbalanced pressure waves at a liquid-contaminant-substrate interface, the unbalanced pressure waves exert a force on the liquid medium, the force on the liquid medium acts on the plurality of particle contaminants to overcome an adhesive force between the particle contaminants and the surface of the semiconductor substrate so as to dislodge the plurality of particle contaminants from the surface of the semiconductor substrate, wherein the liquid medium is selected such that a chemical structure of the liquid medium enables at least partial connection or interaction with the plurality of particle contaminants released from the surface of the semiconductor substrate during the cleaning process sufficiently entrapping the dislodged particle contaminants while preventing re-adhesion of the particle contaminants to the substrate surface;

leaving the liquid medium on the surface of the substrate for a resident time while the acoustic energy is applied through the substrate; and after the resident time has passed, removing the liquid medium with the entrapped particle contaminants from the surface of the substrate using a rinse head that is different from the dispense head, the dispense head and the rinse head being spaced apart, wherein the resident time is computed as a function of distance between the rinse head and the dispense head and relative speed of movement of the substrate under the rinse head and the dispense head.

15. The method of claim 14, wherein the liquid medium is partially hydrolyzed polyacrylamide.

16. The method of claim 14, wherein the acoustic energy is tuned so that the acoustic wave velocity in the liquid medium minimizes damage to features due to cavitation within the liquid medium.

17. The method of claim 14, wherein the acoustic energy is applied to the semiconductor substrate and the liquid medium so as to have a frequency between about 10 KHz to about 10 MHz.

18. The method of claim 14, wherein the resident time is dynamically adjusted by adjusting any one or both of, (a) the distance between the rinse head and the dispense head, and (b) the relative speed of movement of the substrate under the rinse head and the dispense head.

* * * * *